United States Patent [19]
Stein et al.

[11] Patent Number: 6,094,465
[45] Date of Patent: Jul. 25, 2000

[54] METHOD AND APPARATUS FOR PERFORMING DECODING OF CRC OUTER CONCATENATED CODES

[75] Inventors: Jeremy M. Stein, Tel-Aviv; Ayal Bar-David, Haifa, both of Israel

[73] Assignee: QUALCOMM Incorporated, San Diego, Calif.

[21] Appl. No.: 08/821,845

[22] Filed: Mar. 21, 1997

[51] Int. Cl.[7] .............................. H03D 1/04; H04B 1/00; H04L 25/08

[52] U.S. Cl. .......................... 375/346; 375/341; 371/37.5

[58] Field of Search .................................. 375/316, 340, 375/341, 346, 349, 350, 262, 265; 371/43.4, 43.6, 43.7, 43.8, 53, 54

[56] References Cited

U.S. PATENT DOCUMENTS

| | | | |
|---|---|---|---|
| 4,748,626 | 5/1988 | Wong | 371/30 |
| 4,845,714 | 7/1989 | Zook | 371/50 |
| 5,023,889 | 6/1991 | Divsalar et al. | 375/27 |
| 5,056,117 | 10/1991 | Gitlin et al. | 375/102 |
| 5,208,816 | 5/1993 | Seshardi et al. | 371/43 |
| 5,416,787 | 5/1995 | Kodama et al. | 371/43 |
| 5,509,020 | 4/1996 | Iwakiri et al. | 371/43 |
| 5,530,708 | 6/1996 | Miya | 371/43 |
| 5,577,053 | 11/1996 | Dent | 371/37.4 |
| 5,689,511 | 11/1997 | Shimazaki et al. | 370/545 |
| 5,703,902 | 12/1997 | Ziv et al. | 375/200 |
| 5,751,725 | 5/1998 | Chen | 371/5.5 |
| 5,784,392 | 7/1998 | Czaja et al. | 371/43.1 |
| 5,872,775 | 2/1999 | Saints et al. | 370/342 |
| 5,883,923 | 3/1999 | Shimazaki | 375/225 |

FOREIGN PATENT DOCUMENTS

| | | |
|---|---|---|
| 0413505 | 8/1990 | European Pat. Off. ........ H03M 13/12 |
| 0544315 | 11/1992 | European Pat. Off. ........ H03M 13/00 |
| 0751625 | 1/1997 | European Pat. Off. . |
| 9314588 | 7/1993 | WIPO ............................ H04L 27/30 |

OTHER PUBLICATIONS

Czaja, et al. "Variable Data Rate Viterbi Decoder with Modified LOVA Algorithm" IEEE:472–475 (Nov. 6, 1995).

"Viterbi Decoding Algorithm for Convolutional Codes with Repeat Request" by Hirosuke Yamamoto et al.; *IEEE Transactions on Information Theory*, vol. IT–26 No. 26. pp. 540–547.

"Generalized Viterbi Algorithms for Error Detection with Convolutional Codes" by N. Seshadri et al.;AT&T Bell Laboratories, 1989 IEEE pp. 1534–1538.

"Combined Source and Channel Coding of Subband Coded Speech with Post–enhancement" by W.C. Wong et al.;*Communications Systems; Toward Global Integration*, Nov. 1990, vol. 2. 886–890.

*Primary Examiner*—Chi H. Pham
*Assistant Examiner*—Bryan Webster
*Attorney, Agent, or Firm*—Russell B. Miller; Sean English; Thomas R. Rouse

[57] ABSTRACT

A method and apparatus for decoding a frame of multi-rate encoded digital data which contains redundant information provided to validate the decoding operation. A frame of data is received which contains information bits and cyclic redundancy check (CRC) bits. In accordance with the invention, the received frame is decoded and a check is conducted to determine whether the CRC bits correspond correctly for the decoded information bits. If the decoded frame passes the CRC test process, the decoded fame is provided to the user. However, if the decoded frame does not pass the CRC test, then at least one additional decoding process is performed on the received frame. In the first exemplary embodiment of the present invention, on a failure of the CRC check, the data is decoded using a trellis decoder and the data that yields the next most likely path through the trellis is selected. In a second illustrative embodiment, if the CRC test fails, the trellis decoder then identifies all paths having metrics within a predetermined threshold of a metric associated with the optimal path through the trellis. The CRC test is then performed on the decoded frame with respect to the suboptimal paths (starting with the most likely path). If any of these paths pass the CRC check, the information bits are output by the decoder. If not, an error is declared.

13 Claims, 11 Drawing Sheets

METHOD AND APPARATUS FOR PERFORMING DECODING OF CRC OUTER CONCATENATED CODES

BACKGROUND OF THE INVENTION

1. Field of the Invention

The present invention relates to digital signal processing. More particularly, the present invention relates to a novel and improved method and apparatus for decoding a frame of digital data that contains redundant check bits or any other side information which is known about the data.

2. Description of the Related Art

As wireless communication technology has advanced, users have come to demand higher transmission quality in the services provided. One means of providing higher transmission quality to provide that service involves the use of digital transmission techniques. Several digital modulation techniques are known in the art including code division multiple access (CDMA), time division multiple access (TDMA), and frequency division multiple access (FDMA).

The spread spectrum modulation technique of CDMA has significant advantages over other digital modulation techniques. The use of CDMA techniques in a multiple access communication system is disclosed in U.S. Pat. No. 4,901,307, entitled "SPREAD SPECTRUM MULTIPLE ACCESS COMMUNICATION SYSTEM USING SATELLITE OR TERRESTRIAL REPEATERS", assigned to the assignee of the present invention and incorporated by reference herein. The use of CDMA techniques in a multiple access communication system is further disclosed in U.S. Pat. No. 5,103,459, entitled "SYSTEM AND METHOD FOR GENERATING SIGNAL WAVEFORMS IN A CDMA CELLULAR TELEPHONE SYSTEM", assigned to the assignee of the present invention and incorporated by reference herein. The method for providing digital wireless communications using CDMA was standardized by the Telecommunications Industry Association (TIA) in *TIA/EIA/IS-95-A Mobile Station-Base Station Compatibility Standard for Dual-Mode Wideband Spread Spectrum Cellular System* (hereafter IS-95).

Because each user's transmission contributes incrementally to the noise to other user's in a CDMA communication system, the capacity of a CDMA system is maximized by having each user transmit only as much data as necessary. A very effective means of reducing the user's burden on capacity without reducing the quality of service to that user is by means of variable rate data transmission, where the data rate of transmissions by the user varies with time. A method for providing variable rate encoding of speech data is described in detail in U.S. Pat. No. 5,414,796, issued entitled "VARIABLE RATE VOCODER", assigned to the assignee of the present invention and incorporated by reference herein.

In order to protect against channel induced errors, digital error correction techniques are employed in wireless communication systems. One method for detecting and correcting channel induced errors is through the employment of trellis decoding. A Viterbi decoder is a specific type of trellis decoder which has shown significant advantages over other error correction systems. A method and apparatus for performing Viterbi decoding of variable rate data are described in detail in copending U.S. patent application Ser. No. 08/126,477, filed Sep. 24, 1993, entitled "MULTI-RATE SERIAL VITERBI DECODER FOR CDMA SYSTEM APPLICATIONS", which is assigned to the assignee of the present invention and incorporated by reference herein.

However, a need remains in the art for systems and techniques to further improve on the coding gains afforded by the CDMA modulation technique and thereby achieve increases in system capacity.

SUMMARY OF THE INVENTION

The present invention is a novel and improved method and apparatus for decoding a frame of digital data which contains redundant information provided to validate the decoding operation. The present invention improves coding gain in a CDMA system and yields increased system capacity. In the present invention, a frame of data is provided that contains information bits and cyclic redundancy check (CRC) bits. The received frame is decoded and a check is conducted to determine whether the CRC bits correspond correctly for the decoded information bits. If the decoded frame passes the CRC test process, the decoded fame is provided to the user. However, if the decoded frame does not pass the CRC test, then at least one additional decoding process is performed on the received frame.

In the first exemplary embodiment of the present invention, the data is decoded using a trellis decoder and the data that yields the most likely path through the trellis is selected. A CRC test is then performed on the decoded frame of data. If the CRC test fails, the trellis decoder then determines the second most likely path through the trellis. The CRC test is then performed on the decoded frame for a second time. If the decoded frame passes the CRC test, the information bits are output by the decoder. However, if the decoded frame fails the CRC test, then the trellis decoder selects the next most likely path through the trellis. This process is repeated until the CRC test is successfully passed or until a predetermined number of decoding attempts are unsuccessfully made and the decoder declares that it is unable to decode the frame and a frame erasure is declared.

In a second illustrative embodiment, the data is decoded using a trellis decoder and the data that yields the most likely path through the trellis is selected. A CRC test is then performed on the decoded frame of data. If the CRC test fails, the trellis decoder then identifies paths having metrics within a predetermined threshold of a metric associated with the optimal path through the trellis. The CRC test is then performed on the decoded frame with respect to the suboptimal paths as they are found. If any of these paths pass the CRC check, the information bits corresponding to the most likely path are output by the decoder. If not, an error is declared. In the preferred implementation, the decoding is performed with a Viterbi decoder and the metrics used are Yamamoto metrics.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
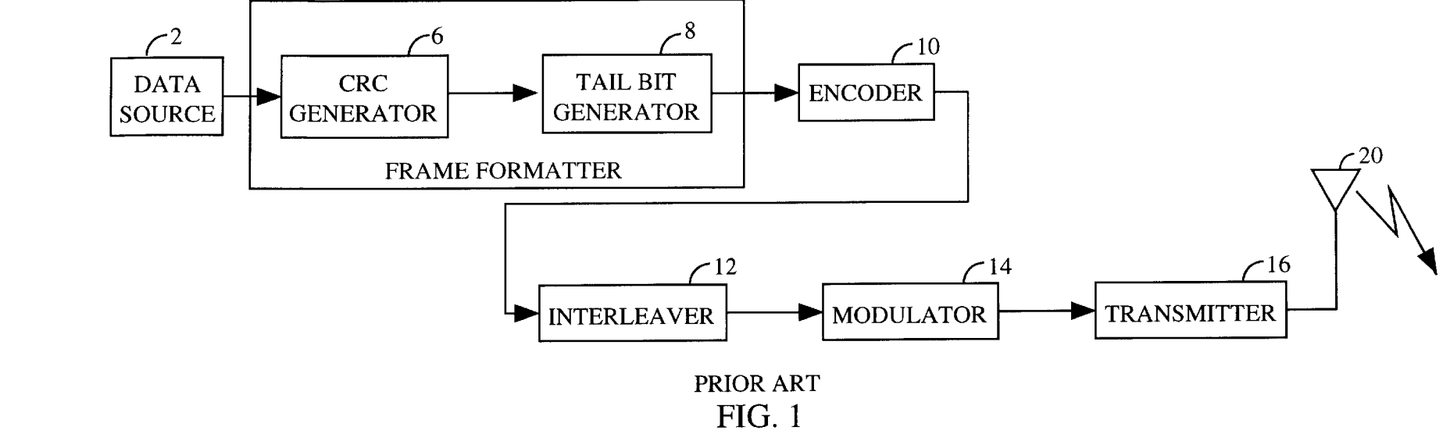
FIG. 1 is an exemplary transmission system which transmits data in frames which contain a set of CRC bits and a set of information bits.

Referring to FIG. 1, data source 2 provides frames of digital data. In the exemplary embodiment, data source 2 provides a frame every 20 ms, though the present invention is equally applicable to other rates. In the exemplary embodiment, data source 2 is a variable rate data source where the number of bits in the frames changes with time. In the exemplary embodiment, data source 2 is a variable rate speech coder, an example of which is described in the aforementioned U.S. Pat. No. 5,414,796.

The speech coder in the U.S. Pat. No. 5,414,796, selects a rate at which to encode a frame of digitized speech samples based on the energy of the samples in that frame. This reduces the number of bits sent, when the user is not speaking, which as described above minimizes the user's interference to other users in a CDMA communication system. It should be noted that the present invention is equally applicable to fixed rate data sources. Moreover, the present invention is equally applicable to the transmission of digital information other than speech, such as facsimile, video or other digitized data.

The frames of information bits from data source 2 are provided to frame formatter 4. In the exemplary embodiment, frame formatter 4 consists of CRC generator 6 and tail bit generator 8. CRC generator 6 generates a set of redundant check bits in accordance with the information bits provided in the frames from data source 2 and appends the redundant bits to the frame. The present invention is applicable to other redundant check bit generators, the design and implementation of redundant bit or parity bit generators are well known in the art. An exemplary embodiment of CRC generator 6 is described in the aforementioned U.S. Pat. No. 5,414,796 and has been standardized in IS-95. It should be noted that the present invention is equally applicable to other redundant bit generators as would be understood by one of ordinary skill in the art.

The frame comprising the information bits and CRC bits is provided to tail bit generator 8 which generates a set of tail bits and appends those bits to the frame. The purpose of the tail bits is to force encoder 10 to a predetermined state when the frame is finished passing through it. In the exemplary embodiment, tail bit generator 8 generates a set of tail bits of value zero so as to force the output of encoder 10 to the zero state.

Referring now to FIGS. 2A–2D, the exemplary frame formats of the present invention are illustrated. These frame formats are referred to as multiplex option 2 frame formats as standardize in the IS-95 standard. It will be readily apparent to one skilled in the art that the present invention is equally applicable to the decoding of data transmitted using other frame formats.

Figure 2A:
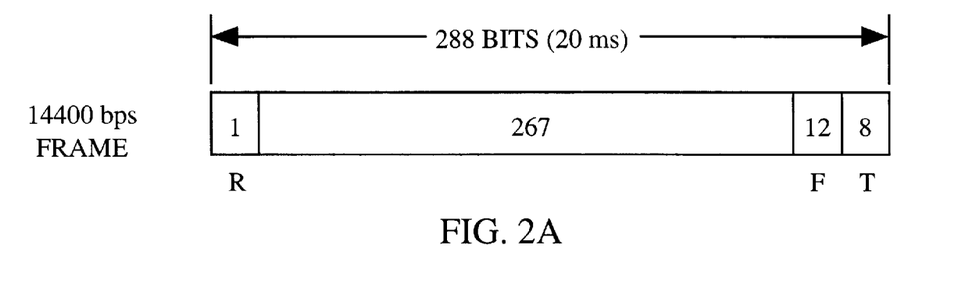
FIGS. 2A–2D are an exemplary illustration of the variable rate frame structure of the present invention.

In the exemplary embodiment, data source 2 provides data at four different rates. Referring to FIG. 2A, if data source 2 provides a frame consisting of 267 information bits, referred to as a full rate frame, then CRC generator 6 generates 12 CRC bits (denoted F) in accordance with the information bits and appends those bits to the frame. Tail bit generator 8 generates 8 tail bits (denoted T) of value zero and appends those bits to the frame. A reserved bit (denoted R) is provided at the start of the frame which can be used for example for controlling transmission power.

Figure 2B:
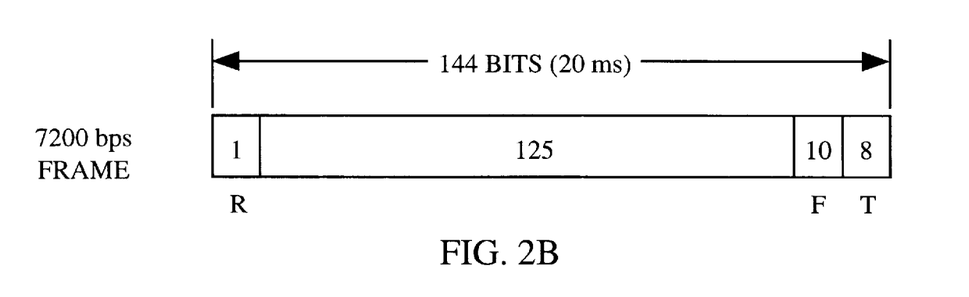

Referring to FIG. 2B, if data source 2 provides a frame consisting of 125 information bits, referred to as a half rate frame, then CRC generator 6 generates 10 CRC bits (denoted F) in accordance with the information bits and appends those bits to the frame. Then tail bit generator 8 generates 8 tail bits (denoted T) of value zero and appends those bits to the frame. A reserved bit (denoted R) is provided at the start of the frame which can be used for example for controlling transmission power.

Figure 2C:
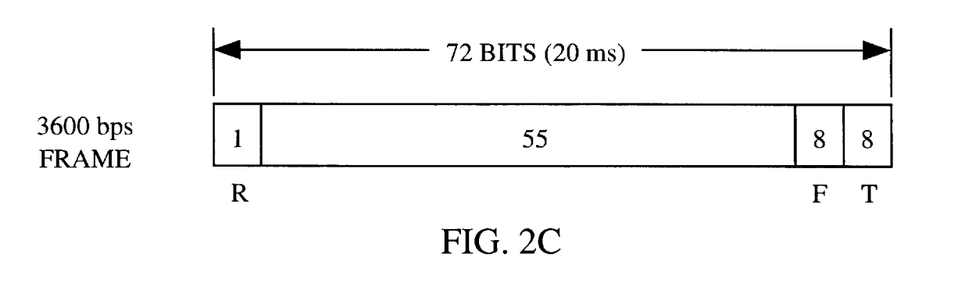

Referring to FIG. 2C, if data source 2 provides a frame consisting of 55 information bits, referred to as a quarter rate frame, then CRC generator 6 generates 8 CRC bits (denoted F) in accordance with the information bits and appends those bits to the frame. Then tail bit generator 8 generates 8 tail bits (denoted T) of value zero and appends those bits to the frame. A reserved bit (denoted R) is provided at the start of the frame which can be used for example for controlling transmission power.

Figure 2D:
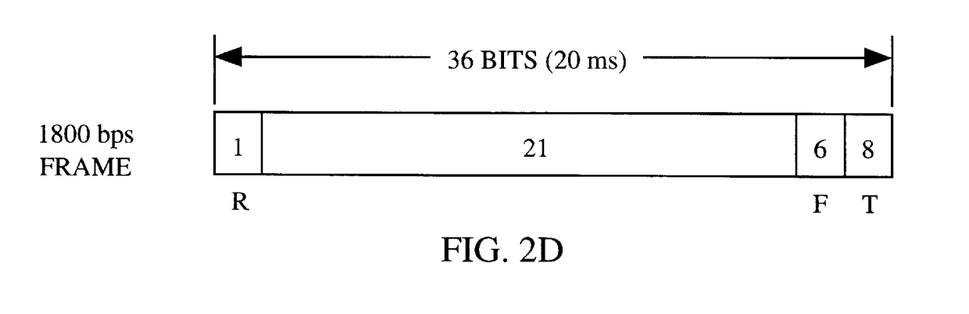

Referring to FIG. 2D, if data source 2 provides a frame consisting of 21 information bits, referred to as an eighth rate frame, then CRC generator 6 generates 6 CRC bits (denoted F) in accordance with the information bits and appends those bits to the frame. Then tail bit generator 8 generates 8 tail bits (denoted T) of value zero and appends those bits to the frame. A reserved bit (denoted R) is provided at the start of the frame which can be used for example for controlling transmission power.

The frames output from frame formatter 4 are provided to encoder 10. In the exemplary embodiment, encoder 10 is a rate ½ convolutional encoder with constraint length nine (k=9). The design and implementation of convolutional encoders is well known in the art. The encoded symbols from encoder 10 are provided to interleaver 12.

In the exemplary embodiment, interleaver 12 selectively provides redundancy in the frame so that the symbol data occupies the full capacity of the frame. If the frame is less than full rate, then interleaver 12 provides duplicates of the symbols. Thus, if the frame is half rate, then interleaver 12 provides redundancy of rate 2 with each frame containing a single original copy of the symbols and a duplicate of those symbols, if the frame is quarter rate, the interleaver 12 provides redundancy of rate 4 with each frame containing a single original copy of the symbols and three duplicates of those symbols and if the frame is of rate one eight, then interleaver 12 provides redundancy of rate eight with each frame containing a single original copy of the symbols and seven duplicates of those symbols. After symbol repetition they are punctured by deleting 2 out of every 6 symbols to obtain a given number of symbols as described in the IS-95 standard. Interleaver 12, then, reorders the symbols in accordance with a predetermined reordering format. In the exemplary embodiment, interleaver 12 provides redundancy and reorders the frames as described in the IS-95 standard.

The revised symbols are provided to modulator 14 which modulates the symbols in accordance with a predetermined modulation format. In the exemplary embodiment, modulator 14 is a CDMA modulator as described in detail in the aforementioned U.S. Pat. Nos. 4,901,307, and 5,103,459. The modulated frame of data is provided to transmitter 16 which upconverts and amplifies the frame and transmits the frame through antenna 20.

Figure 3:
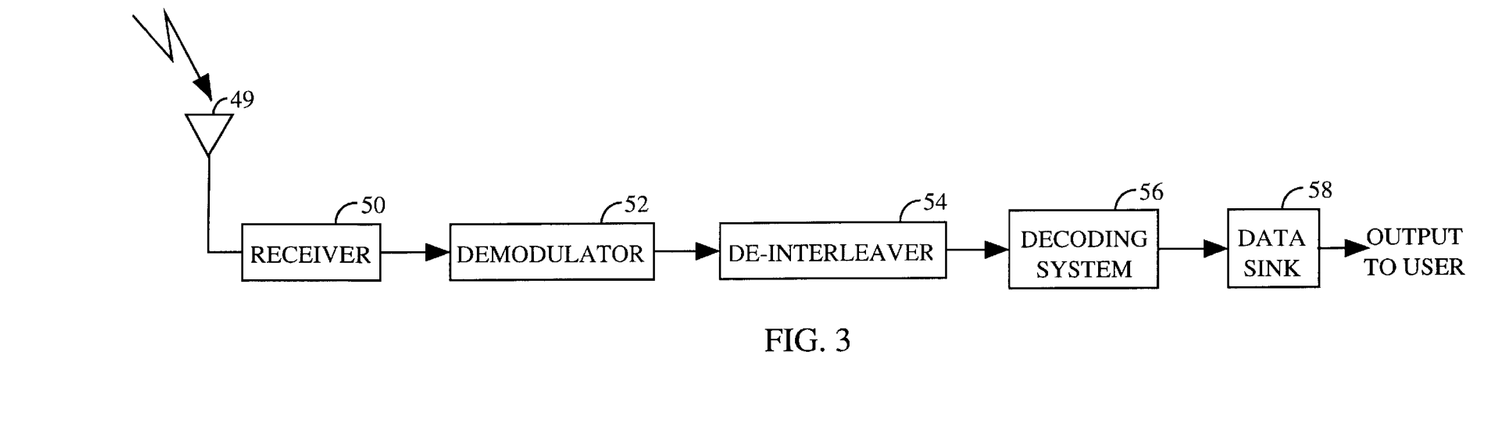
FIG. 3 is an exemplary implementation of the decoder of the present invention.

Referring to FIG. 3, a signal transmitted by the transmission system 1 of FIG. 1, is received by antenna 49 and provided to receiver (RCVR) 50. Receiver 50 downconverts, filters and amplifies the received signal and provides it to demodulator 52. Demodulator 52 demodulates the received signal in accordance with a predetermined demodulation format. In the exemplary embodiment, demodulator 52 is a CDMA demodulator as is described in detail in the aforementioned U.S. Pat. Nos. 4,901,307, and 5,103,459.

The demodulated frame of data is provided to de-interleaver 54 which reorders the soft symbol data in the frame in accordance with a predetermined reordering format and adds zeros in the places where the symbols were deleted in the transmission process to obtain a revised frame format. The revised frame of soft decision symbol data is provided to decoding system 56. Decoding system 56 decodes the data and provides the decoded data to data sink 58. Data sink 58 may provide post processing on the decoded frame of data. For example, if the data is compressed speech data, then the data sink 58 converts the speech parameters to digitized speech samples in accordance with a predetermined expansion format, such as that described in U.S. Pat. No. 5,414,796.

Figure 4:
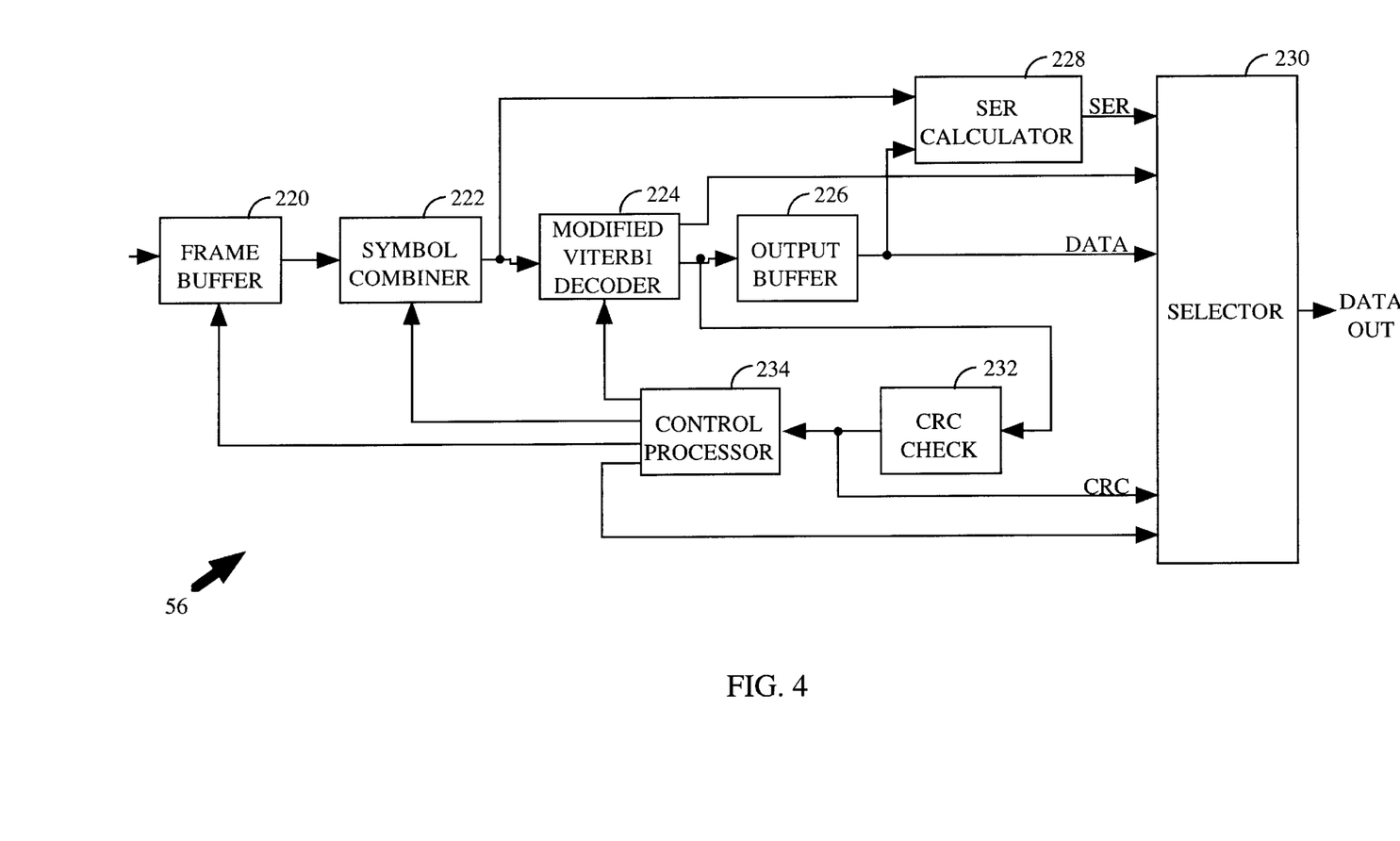
FIG. 4 is a block diagram of the first exemplary embodiment of the decoding system of the present invention.
Figure 5:
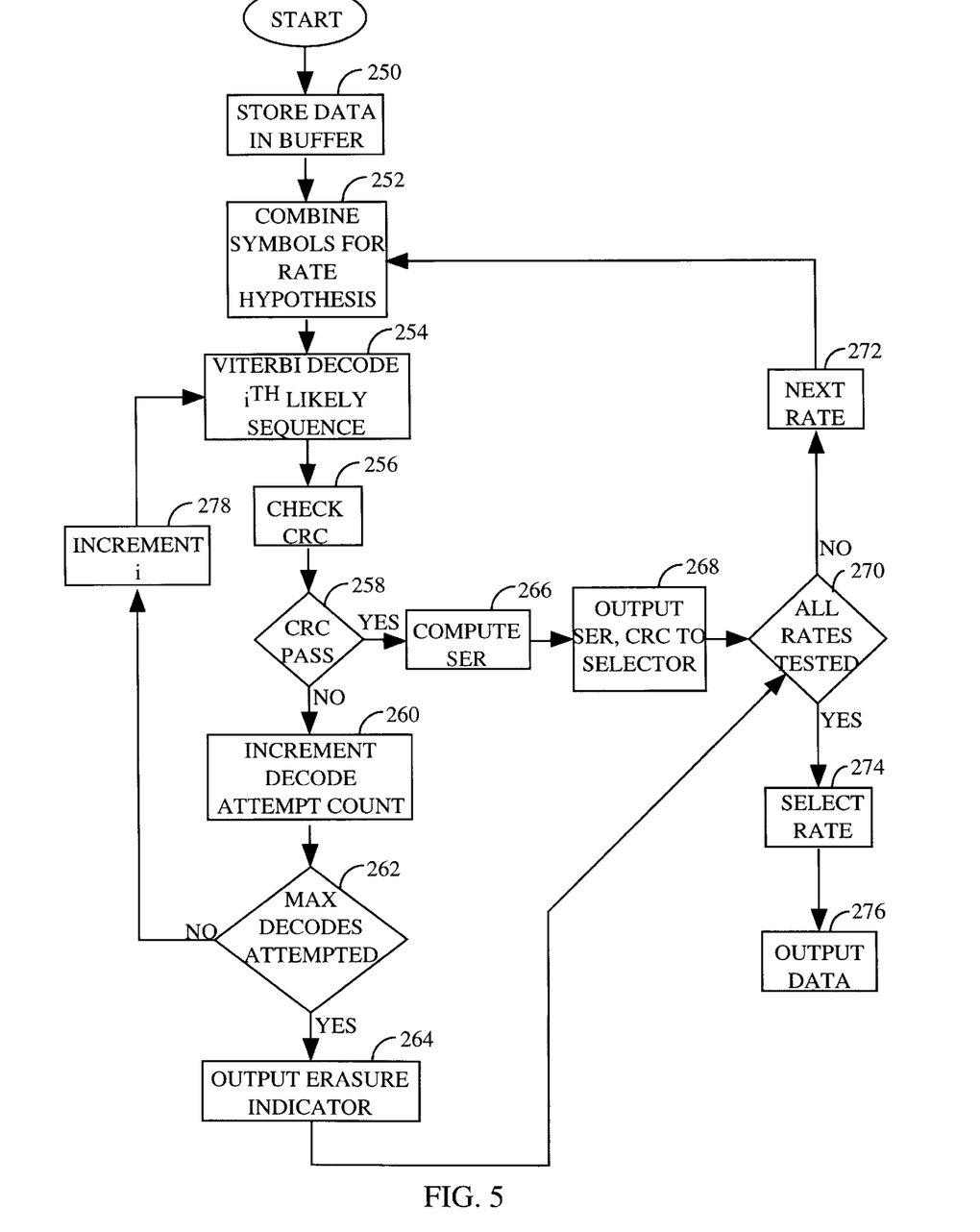
FIG. 5 is a flowchart describing the method of decoding data of the first exemplary embodiment.

FIG. 4 illustrates apparatus of the first exemplary embodiment of the decoding system 56 of the present invention and FIG. 5 provides an accompanying flowchart illustrating the method of the first exemplary embodiment of the present invention. As illustrated in FIGS. 4 and 5, at block 250, the frame of revised soft symbol data from de-interleaver 54 (of FIG. 3) is provided to and stored in frame buffer 220 (of FIG. 4).

Then, in block 252, the symbols are combined in symbol combiner 222 in accordance with the current rate hypothesis. The combining process takes advantage of the fact that for rates less than full rate there is redundancy in the transmitted symbol data and so a better estimate of the transmitted symbol data can be arrived at by summing the energy of all redundant copies of that symbol. The process of generating an improved estimate of the symbol is described in detail in the aforementioned copending U.S. patent application Ser. No. 08/126,477.

The exemplary embodiment first tests the hypothesis that the frame was transmitted at full rate. Under the full rate hypothesis, no symbol repetition exists and so no combining of symbol data is performed. In block 254, the data from symbol combiner 222 is provided to modified Viterbi decoder 224. In the exemplary embodiment, modified Viterbi decoder 224 is a Viterbi decoder but one skilled in the art will appreciate that other forms of trellis decoders are equally applicable. The design and implementation of Viterbi decoders is known in the art and a specific implementation of the Viterbi decoder is described in the aforementioned copending U.S. patent application Ser. No. 08/126,477.

Modified Viterbi decoder 224 computes an estimate of the transmitted information bits and CRC bits in the frame and provides that frame estimate to CRC test subsystem 232. In block 256, CRC test subsystem 232 generates a set of redundant bits from the decoded information bits as was described with reference to CRC generator 6. CRC test subsystem 232 compares the CRC bits generated from the information bit estimates with the estimates of the redundant bits from modified Viterbi decoder 224. The result of that comparison is provided to control processor 234 which determines whether the CRC test is passed.

If, in control block 258, the CRC test is passed, then the method proceeds to block 266. In block 266, the symbol error rate (SER) calculator 228 computes the symbol error rate for the decoded frame. SER calculator 228 generates a hard decision estimate of the received symbol data or receives the hard decision estimates from modified Viterbi decoder 224. Then, SER calculator 228 receives the decoded data of the frame from modified Viterbi decoder 224 and encodes the frame using the same encoding operation that was performed by encoder 10 (FIG. 1) to generate a set of re-encoded symbol data. The re-encoded symbol data is compared symbol by symbol to the hard decision symbol data and the number of discrepancies between the two sets of symbol data is the symbol error rate which is provided to selector 230 in block 268.

In this embodiment, output buffer 226 provides the decoded symbol data to selector 230 only after the CRC test has been passed for that decoding of that rate hypothesis. In a preferred embodiment, modified Viterbi decoder 224 provides metric data to selector 230 to assist in the rate selection. The metric data provided to selector could be a single bit Yamamoto metric or a total metric.

If the CRC test fails in block 258, then in block 260 control processor 234 increments a count of the number of attempts made at decoding the frame under the current rate hypothesis. In block 262, control processor 234 determines whether the number of attempts at decoding the frame has reached a predetermined maximum number of attempts for decoding the frame at the current rate hypothesis. If the maximum number of attempts has been reached, then the method proceeds to block 264 and control processor 234 provides a signal to selector 230 indicating that the frame cannot be decoded under the current rate hypothesis.

If in control block 262, the maximum number of attempts to decode the frame at the current rate had not been reached, then control processor 234 provides a message to modified Viterbi decoder 224. In block 278 in response to the message from control processor 234, modified Viterbi decoder 224 increments its path count (i) by one. Then in block 254, modified Viterbi decoder 224 finds the ith best path through the trellis. The method proceeds to block 256 and the process repeats as described previously.

In block 270, control processor 234 determines whether all possible rates have been tested. If not, then the method proceeds to block 272 which selects the next rate to be tested, then the method proceeds to block 252 and the next rate hypothesis is tested. In response to a signal from control processor 234, frame buffer 220 provides the frame data to symbol combiner 222. Control processor 234 provides a signal indicative of the rate hypothesis to be tested to symbol combiner 222. In block 252, symbol combiner 222 combines the symbol data in accordance with the rate hypothesis to be tested. The method continues to block 254 and proceeds as described above.

If in block 270, all rates have been tested, then in block 274 selector 230 determines the most likely rate at which the data was transmitted and provides the data corresponding to that rate in block 276. The selector 230 may decide to erase the frame due to bad quality measures. In the exemplary embodiment, selector 230 determines the rate based on the symbol error rate of the different decoded frames and the metric data values.

A large number of methods can be employed to perform the additional path search of the first exemplary embodiment. However, many of the methods require too much memory for storage. In the preferred method of the first exemplary embodiment, a method is applied which reduces the amount of memory and time required for the path search. For example, one method would be to decode all paths within a certain metric threshold of the best path that are encountered while running modified Viterbi decoder 224.

Figure 6:
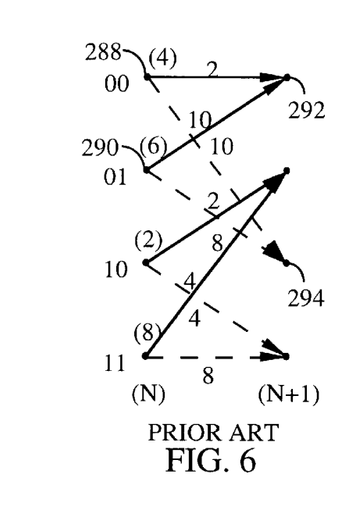
FIG. 6 is an illustration of the state transitions in a trellis decoder.
Figure 7:
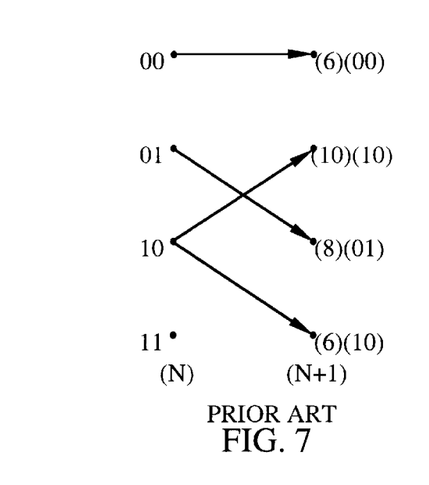
FIG. 7 is an illustration of the selected paths in the state transition trellis of FIG. 6.
Figure 8:
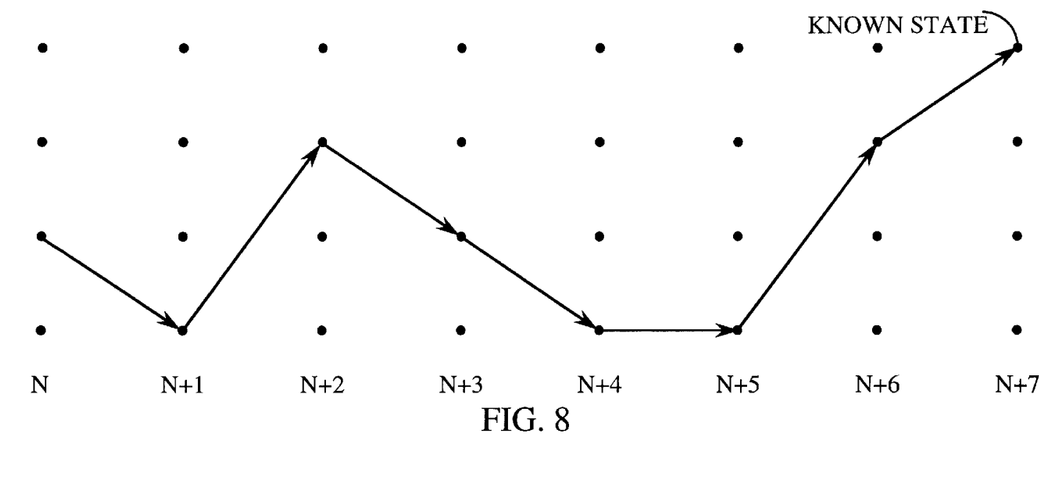
FIG. 8 is an illustration of a path selection through a trellis decoder.

First a brief review of trellis decoding operation is presented in FIGS. 6, 7 and 8. FIG. 6 shows the possible state transition in a constraint length k=3 trellis decoder. The number of possible states (S) in a trellis decoder is given by the equation:

$$S=2^{k-1} \quad (1)$$

Figure 9:
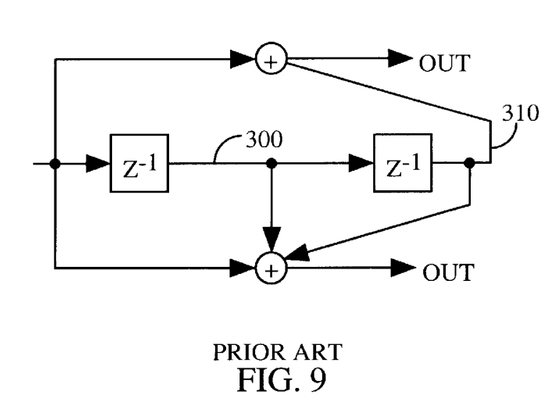
FIG. 9 is an illustration of an encoder that has four possible states.

Thus, in FIG. 6 there are four states so k=3. Referring to FIG. 9, the state of the encoder can be defined by the values of the bits at points 300 and 310. There are four such states. When the next bit moves into point 300, the value at point 300 will move into point 310 and the value of point 310 will be discarded.

Associated with each state is a state metric which is inversely related to the probability of the survivor sequence at the state at that time, so the higher the metric the less likely the probability. The state metrics for each of the states are in parentheses above the initial states in FIG. 6. In addition, there is an associated branch metric which is inversely related to the probability of the state transition from one state at time N to another state at time N+1. So for example looking at the initial state 01 (point 290) if the next bit entering the encoder is a 0 then the state of the encoder at time N+1 will be 00 (point 292). Whereas, if the initial state is 01 (point 290) and the next bit to enter the encoder is 1 then the state at N+1 will be 10 (point 294).

The value of the state metric at time N+1 is computed by adding the state metric of the initial state at time N+1 with the branch for the transition to that state. The branch which results in the lower state metric is selected and the other branch leading to that state is discarded. In FIG. 7, the branches selected in accordance with the state and branch metrics of FIG. 6 is illustrated. In the N+1 time, the newly computed state metric is first shown in parenthesis and then the value of the state from which the selected transition occurred is shown.

For example, if one wants to compute the state metric for state 00 at time N+1 (point 292), then there are two paths leading to state 00. Note this is always the case when an encoder of rate 1/n or an encoder based on puncturing the data stream of an encoder of rate 1/n is used. One path leads from state 01 (point 290). The state metric at state 01 (point 290) is 6 and the associated branch metric for the transition to state 00 (point 292) has value 10. Therefore, the state metric of point state 00 at time N+1 (point 292) would have value 16 if that branch were selected. A second path leads from state 00 (point 288). The state metric at state 00 (point 288) is 4 and the associated branch metric for the transition to state 00 (point 292) has value 2. Therefore, the state metric of point state 00 at time N+1 (point 292) would have value 6 if that branch were selected. So the branch from state 00 (point 288) is selected and the state is assigned state metric 6.

FIG. 8 illustrates a selected path through a trellis. Because of the tail bits, the final state is known. Because, in the exemplary embodiment, the tail bits are all zeroes, the final state is known to be the all zero state. As there is only one path leading to that state, the path that is selected is the path that leads to that known state. Once the path is known the data is output by means of a chainback operation wherein the decoder traces back along the selected path and outputs the bit that resulted in the selected transition. For example, in the transition from state 10 to state 11, the bit output would have the value 1. This is the method used to select the best path through the trellis. The selection of suboptimal paths remains as discussed more fully below.

Figure 10:
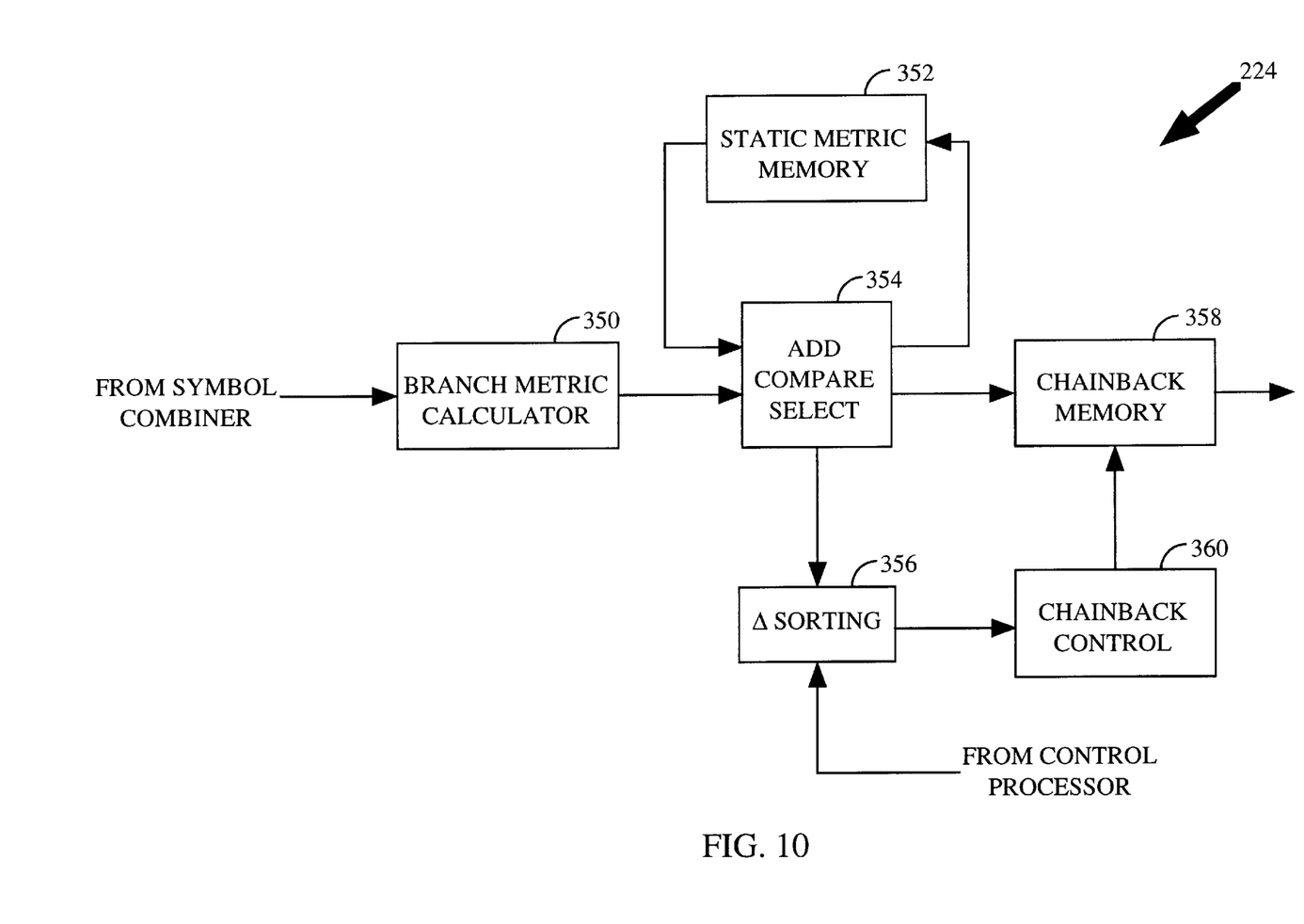
FIG. 10 is a block diagram of the trellis decoder of the first exemplary embodiment.

The decoder 224 of the first exemplary embodiment of the present invention is illustrated in FIG. 10. The combined symbol from the symbol combiner (not shown) is provided to branch metric calculator 350. The design and implementation of branch metric calculators are well known in the art. Add Compare Select (ACS) element 354, in accordance with the branch metrics from branch metric calculator 350, determines the values of the state metrics as described with reference to FIGS. 10 and 11 above. The newly computed state metrics are then stored in state metric memory 352 and an indication of the selected branch is provided to chainback memory 358. When all state metrics are computed for the frame, chainback memory element 358, under the control of chainback control 360, selects the optimal path through the trellis as described above and outputs the decoded data to a CRC bit check element (not shown).

If the CRC test fails, then a second best path through the trellis is determined. The algorithm for finding the best path (i.e. Viterbi algorithm) through the trellis is rerun. However, in addition to the steps described above, in accordance with an illustrative embodiment, a measure of the distance between the best path through the trellis and the rejected path at each time instant is calculated and stored in Δ Sorting means 356. The value of $\Delta_{s,p}$ is the value of the difference in the metric value of state (s) if the rejected path were selected and the metric value of state (s) on the selected path (p).

$\Delta_{s,p}$=State metric rejected path−State metric of selected path

Figure 11:
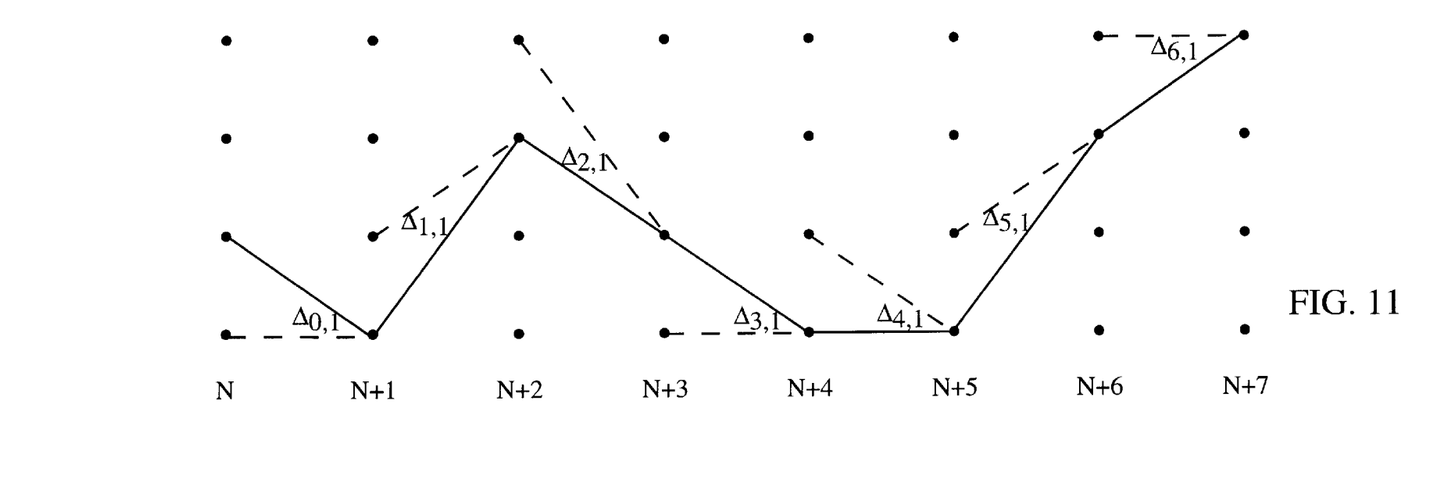
FIG. 11 is an illustration of the best path through a trellis and the computed path selection difference values associated with that path.

Examples of the $\Delta_{s,p}$ values are illustrated in FIG. 11. Every path has associated with it a value $\Delta_p$ which is measured relative to the best path. The value of $\Delta_p$ is given by the $\Delta_p$ of the better path with which that path merges and the difference of the metrics at the merging point $\Delta_{s,p}$. Thus, the value of $\Delta_p$ of the best path (i.e. the output of the Viterbi algorithm) is zero.

Figure 12:
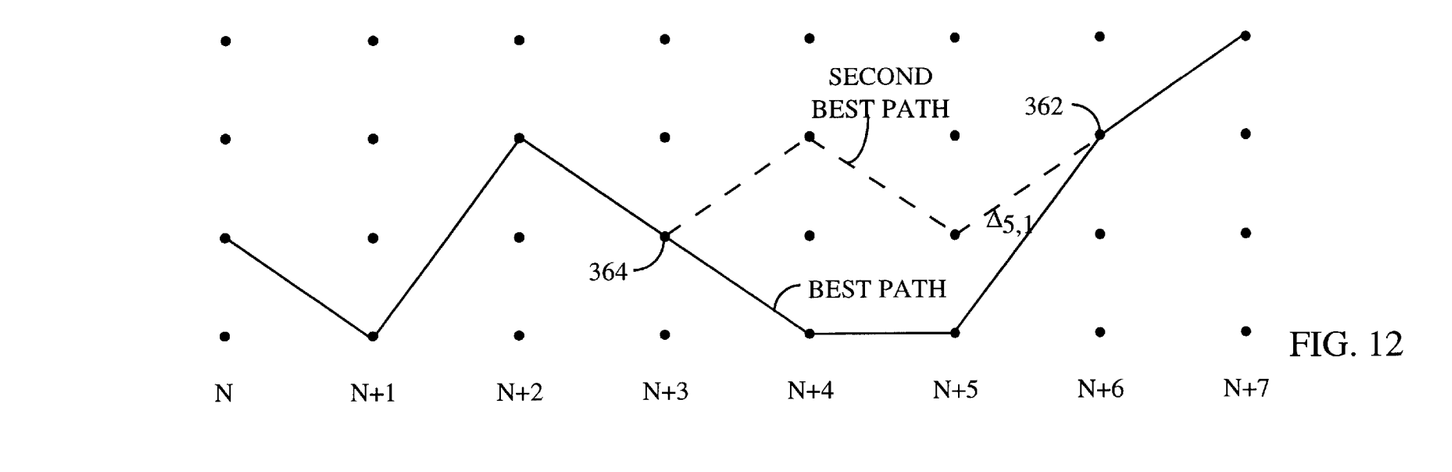
FIG. 12 is an illustration of a second best path selected in accordance with the first embodiment.

$\Delta$ Sorting means 356 determines the lowest of the $\Delta$ values $\Delta_{min}$. At the point where $\Delta_{min}$ is found, a chainback operation is run to determine the path that led to that point of divergence. Referring to FIG. 12, the state metric computation process was rerun as described and the minimum path difference was found by $\Delta$ sorting means 356 to be $\Delta_{5,1}$ at point 362. From point 362, chainback memory 358 under the control of chainback controller 360 determines the second best path and corresponding decoded data sequence. This is obtained by replacing the first N+6 data bits in the data corresponding to the best path. In a preferred embodiment, the chainback operation is truncated within a few constraint lengths of the point of path divergence, because rarely are error events longer than a few constraint lengths. In FIG. 12. this occurs at point 364. The value $\Delta_p$ of the second best path in FIG. 12 is $\Delta_p=\Delta_{5,1}$.

Figure 13:
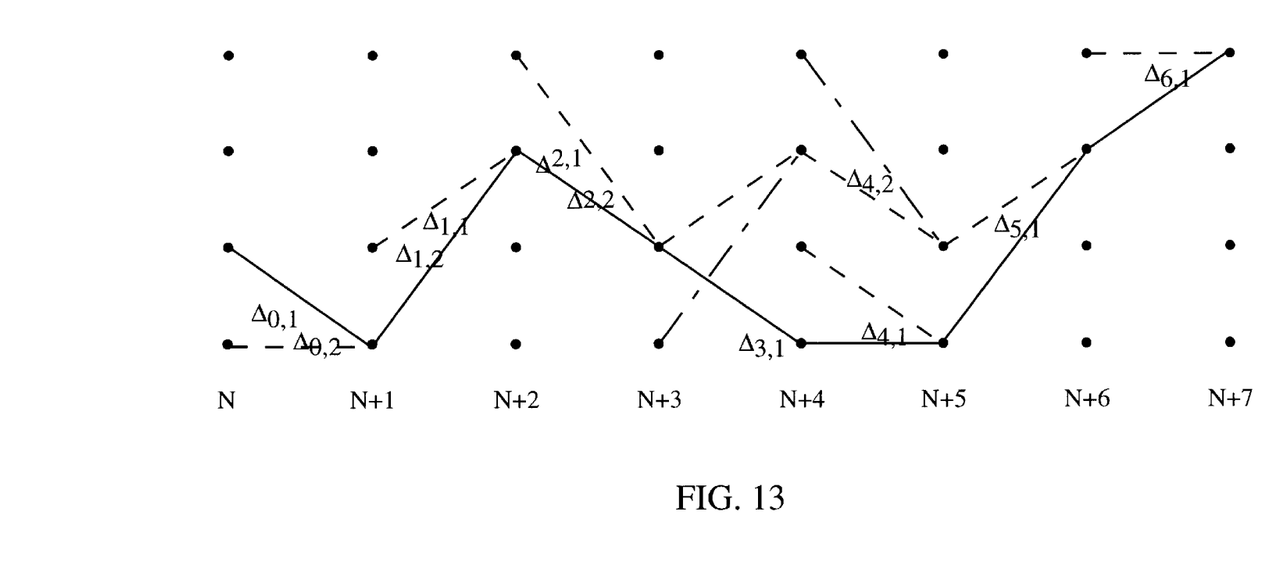
FIG. 13 is an illustration of the first and second selected paths through a trellis and the computed path selection difference values associated with the third path selection process.

To find the third best path, the same state metric computation process is performed for a third time and the $\Delta_{s,p}$ values are computed as described above but this time they are computed for the path selections relative to the second best path. These need to be calculated only up to the time instance before the second best path merges with the best path. In other words the time instance N+5 in FIGS. 12 and 13. Referring to FIG. 13, ACS 354 computes the necessary path difference values to the second path ($\Delta_{0,2}$, $\Delta_{1,2}$, $\Delta_{2,2}$, $\Delta_{3,2}$ and $\Delta_{4,2}$). It should be noted that some of these metrics may have been calculated previously but must be considered again. The values for comparison are based not on the distance to the second best path but on the distance to the best path. Thus, for the metric values provided to $\Delta$ sorting means 356 must be relative to the best path through the trellis. For example to get the metric difference for comparison for the path designated $\Delta_{4,2}$ a $\Delta_p$ value for that path must be computed by summing the $\Delta_{4,2}$ (the distance from the second path) with $\Delta_{5,1}$ the distance of the second path to the first path. ACS 354 provides the computed values to $\Delta$ sorting means 356. $\Delta$ sorting means 356 then finds the third closest path by finding the lowest of the $\Delta_p$ values for the paths merging with the best and second best paths.

In the illustrative embodiment, $\Delta$ sorting means 356 does not store all of the $\Delta_p$ values but only the lowest M values, where M is the maximum number of paths that will be searched. Then for each subsequent ith best path, only the minimum M-i values must be stored.

In an alternative embodiment, the decoding process is not rerun to find each suboptimal path, rather the state metrics are stored and reused for each path search. This reduces the number of computations but increases the amount of memory required. It should be remembered that the examples illustrated in FIGS. 11–13 are greatly simplified for the purposes of illustration. In the exemplary embodiment, the frame size is 288 bits of information and the length of the code is nine (k=9) which includes 256 states. Thus, assuming storage of the state metrics requires approximately one byte of information, the memory needed to store the state metrics for every state, assuming 5 bit state metrics, would require approximately 74 kilobytes of memory.

Figure 14:
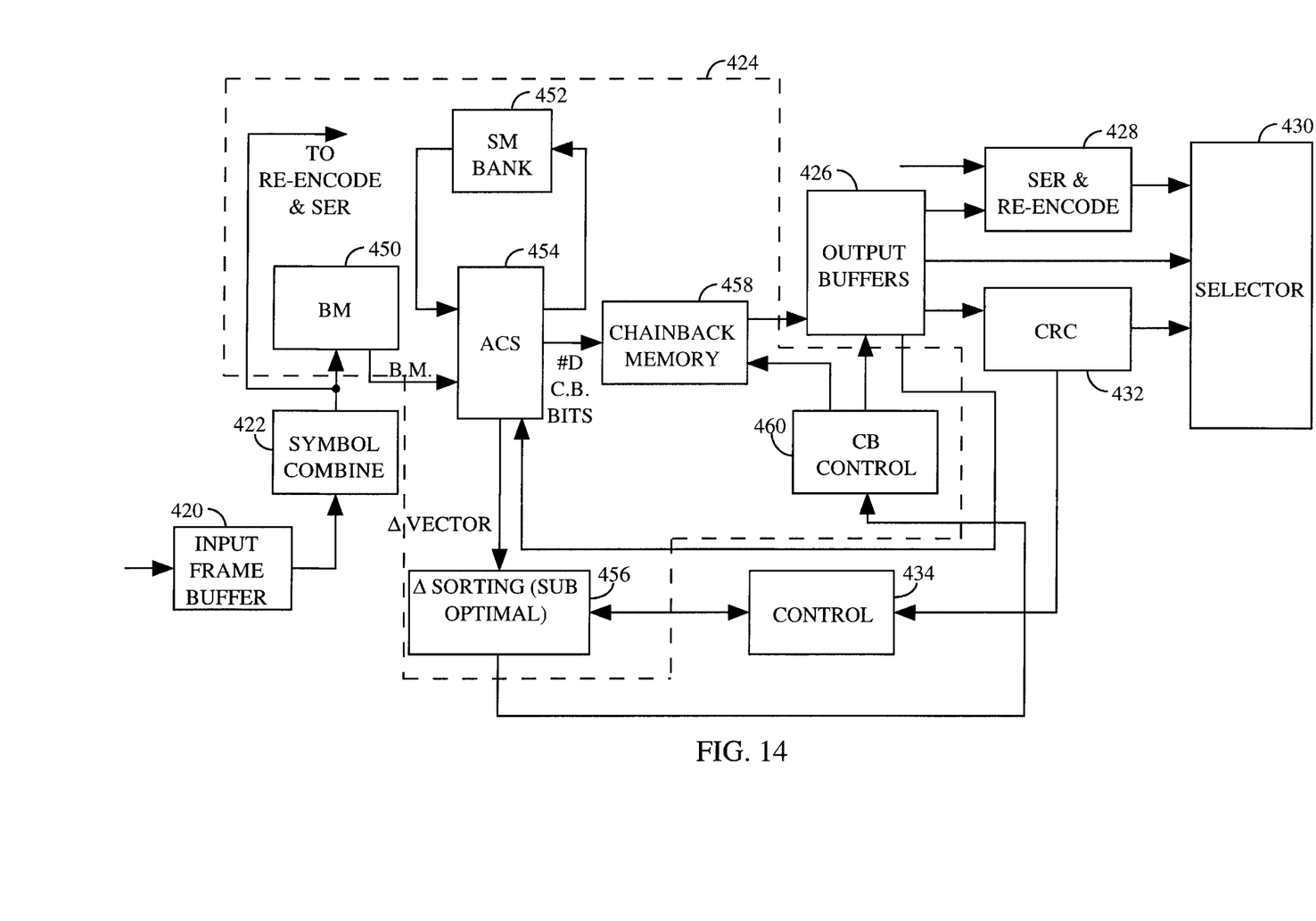
FIG. 14 illustrates apparatus of the second exemplary embodiment of the decoding system of the present invention.
Figure 15:
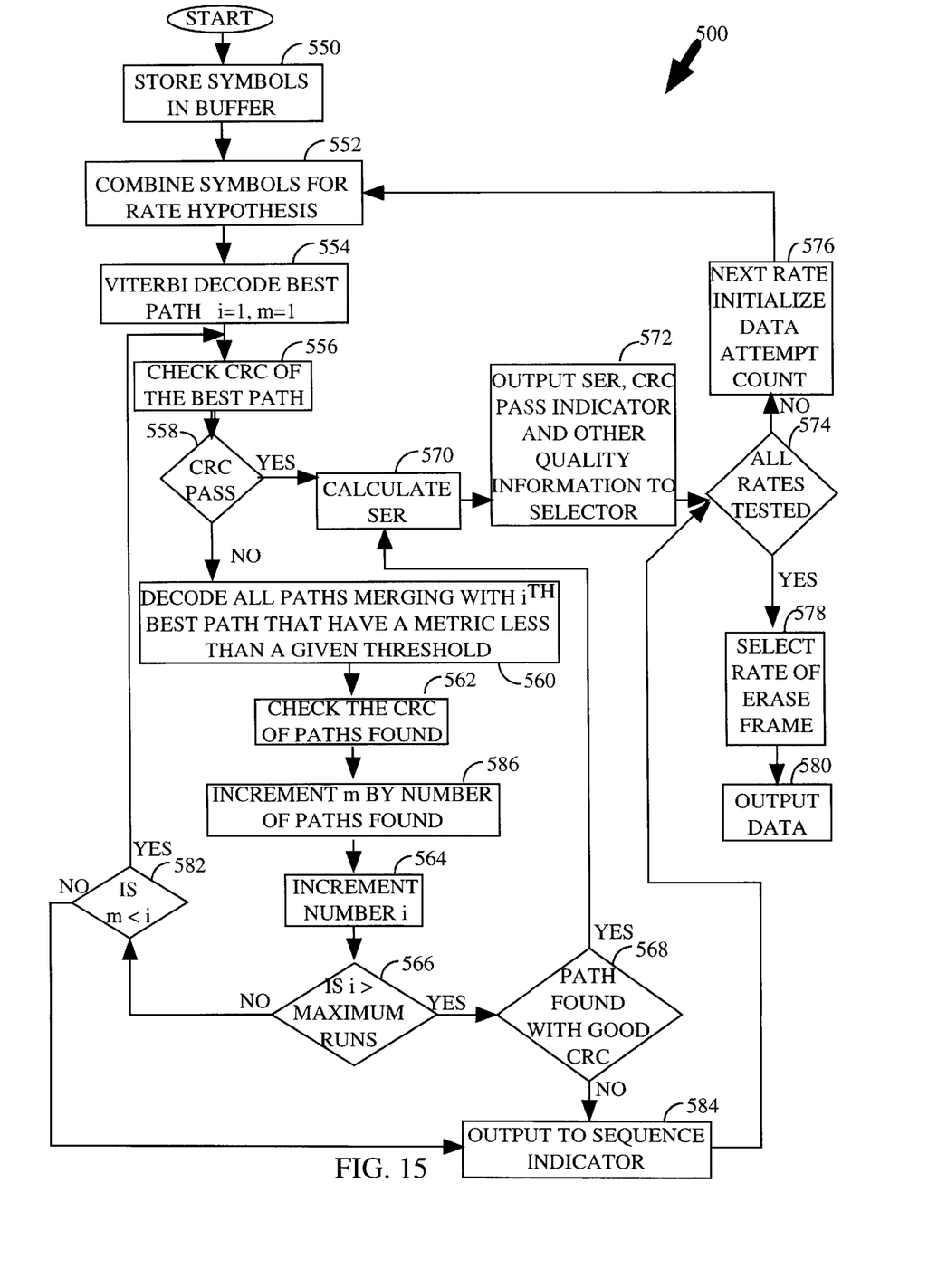
FIG. 15 is a flowchart illustrating the method of the second exemplary embodiment of the present invention.

FIG. 14 illustrates apparatus of the second exemplary embodiment of the decoding system 56 of the present invention and FIG. 15 provides an accompanying flowchart 500 illustrating the method of the second exemplary embodiment of the present invention. In block 550, the frame of revised soft symbol data from de-interleaver 54 is provided to and stored in frame buffer 420.

Then, in block 552, the symbols are combined in symbol combiner 422 in accordance with the current rate hypothesis. The combining process takes advantage of the fact that for rates less than full rate there is redundancy in the transmitted symbol data and so a better estimate of the transmitted symbol data can be arrived at by summing the energy of all redundant copies of that symbol. The process of generating an improved estimate of the symbol is described in detail in the aforementioned copending U.S. patent application Ser. No. 08/126,477.

The exemplary embodiment first tests the hypothesis that the frame was transmitted at full rate. Under the full rate hypothesis, no symbol repetition exists and so no combining of symbol data is performed. In block 554, the data from symbol combiner 422 is provided to modified Viterbi decoder 424. In the exemplary embodiment, modified Viterbi decoder 424 is a Viterbi decoder but one skilled in the art will appreciate that other forms of trellis decoders are equally applicable. The design and implementation of Viterbi decoders is known in the art and a specific implementation of the Viterbi decoder is described in the aforementioned copending U.S. patent application Ser. No. 08/126,477. In the present embodiment, the Viterbi decoder 424 includes a branch metric calculator 450. The combined symbol from the symbol combiner 422 is provided to the branch metric calculator 450. The design and implementation of branch metric calculators are well known in the art. Add Compare Select (ACS) element 454, in accordance with the branch metrics from branch metric calculator 450, determines the values of the state metrics as described with reference to FIGS. 6 and 7 above. The newly computed state metrics are then stored in state metric memory 452 and an indication of the selected branch is provided to chainback memory 458. When all state metrics are computed for the frame, chainback memory element 458, under the control of chainback control 460, selects the optimal path through the trellis as described above and outputs the decoded data to a CRC bit check element 432. In block 554, the counter i and value of m are set to 1. The number of decoder runs is denoted by i and the number of paths whose CRCs are checked is denoted by m.

Modified Viterbi decoder 424 thereby computes an estimate of the transmitted information bits and CRC bits in the frame. In block 556, CRC test subsystem 432 generates a set of redundant bits from the decoded information bits as was described with reference to CRC generator 6 in FIG. 1. CRC test subsystem 432 compares the CRC bits generated from the information bit estimates with the estimates of the redundant bits from modified Viterbi decoder 424. The result of that comparison is provided to control processor 434.

If, in control block 558, the CRC test is passed, then the method proceeds to block 570. In block 570, the symbol error rate (SER) calculator 428 computes the symbol error rate for the decoded frame. SER calculator 428 generates a hard decision estimate of the received symbol data or receives the hard decision estimates from modified Viterbi decoder 424. Then, SER calculator 428 receives the decoded data of the frame from modified Viterbi decoder 424 and encodes the frame using the same encoding operation that was performed by encoder 10 to generate a set of re-encoded symbol data. The re-encoded symbol data is compared symbol by symbol to the hard decision symbol data and the number of discrepancies between the two sets of symbol data is the symbol error rate which is provided to selector 430 in block 570.

In the exemplary embodiment, output buffer 426 provides the decoded symbol data to selector 430 only after the CRC test has been passed for that decoding of that rate hypothesis. In a preferred embodiment, modified Viterbi decoder 424 provides metric data to selector 430 to assist in the rate selection. The metric data provided to selector could be a single bit Yamamoto metric or a total metric.

If the CRC test fails in block 558, then in block 560 the modified Viterbi decoder 424 performs a second run on the symbol data 422 for the given rate hypothesis. In this run the modified Viterbi decoder is said to process the most likely path found by the Viterbi decoder in the previous run. The ACS block 454 proceeds through the trellis updating the state metrics 452 according to the calculated branch metrics 450, but in addition to this standard Viterbi decoding procedure, outputs to a Δ sorting circuit 456 the metrics of all paths merging with the processed path (the best path for the second run of the decoder) supplied to the ACSs by the output buffer 426. The chainback control 460 performs a chainback to obtain the data sequence associated with this path. A chainback will be performed only if the metric of the path fills some criteria threshold. This threshold criteria will be explained in the following. The paths found in this procedure is stored in the output buffers 426.

Block 562 checks the CRCs of the paths found by block 560 and stored in the buffers 426, with the CRC checker 432. The result of the CRC check are noted by the controller 434. In block 562 the control processor 434 increments the number of paths found m, for this rate hypothesis. In block 586 the control processor 434 increments the number of runs i performed by the modified Viterbi decoder 424.

If in control block 556, the maximum number of runs has not yet been reached, then the control processor 434 checks in block 582 if there are paths that have been already found, which the modified Viterbi decoder 424 has not yet processed (i.e., paths merging with it have not yet been attempted to find). If there are no such paths, in block 584, the controller 434 indicates to the selector 430 that no paths for this rate hypothesis could be found by the decoder.

If in control block 582, there are still paths that have been already found, which the modified Viterbi decoder 424 has not yet processed, the decoder proceeds to block 556 to check if the CRC of the ith most likely path, which has not yet been processed, has a CRC that passes. If the CRC fails in control block 558, the controller 434 indicates to the modified Viterbi decoder 424 to process the ith best path. This is done in block 560 as described earlier.

If in control block 582, there are no paths that have been found but not yet processed, the decoder proceeds to block 584 indicating to the selector 430 that no paths for this rate hypothesis could be found. If in control block 566, the maximum number of runs has been reached, then the control processor 434 checks in block 568 if a path has been found that passes the CRC performed by the CRC checker 432. If there is no such path the method proceeds to block 584. If there is a path that has a CRC that passes, the method proceeds to block 570.

In block 574, control processor 434 determines whether all possible rates have been tested. If not, then the method proceeds to block 576 which selects the next rate to be tested, then the method proceeds to block 552 and the next rate hypothesis is tested. In response to a signal from control processor 434, frame buffer 420 provides the frame data to symbol combiner 422. Control processor 434 provides a signal indicative of the rate hypothesis to be tested to symbol combiner 422. In block 552, symbol combiner 422 combines the symbol data in accordance with the rate hypothesis to be tested. The method proceeds to block 554 and proceeds as described above.

If in block 574, all rates have been tested, then in block 578 selector 430 determines the most likely rate at which the data was transmitted and provides the data corresponding to that rate in block 580. The selector 430 may decide to erase the frame due to bad quality measures. In the exemplary embodiment, selector 430 determines the rate based on the symbol error rate of the different decoded frames and the metric data values.

Figure 16:
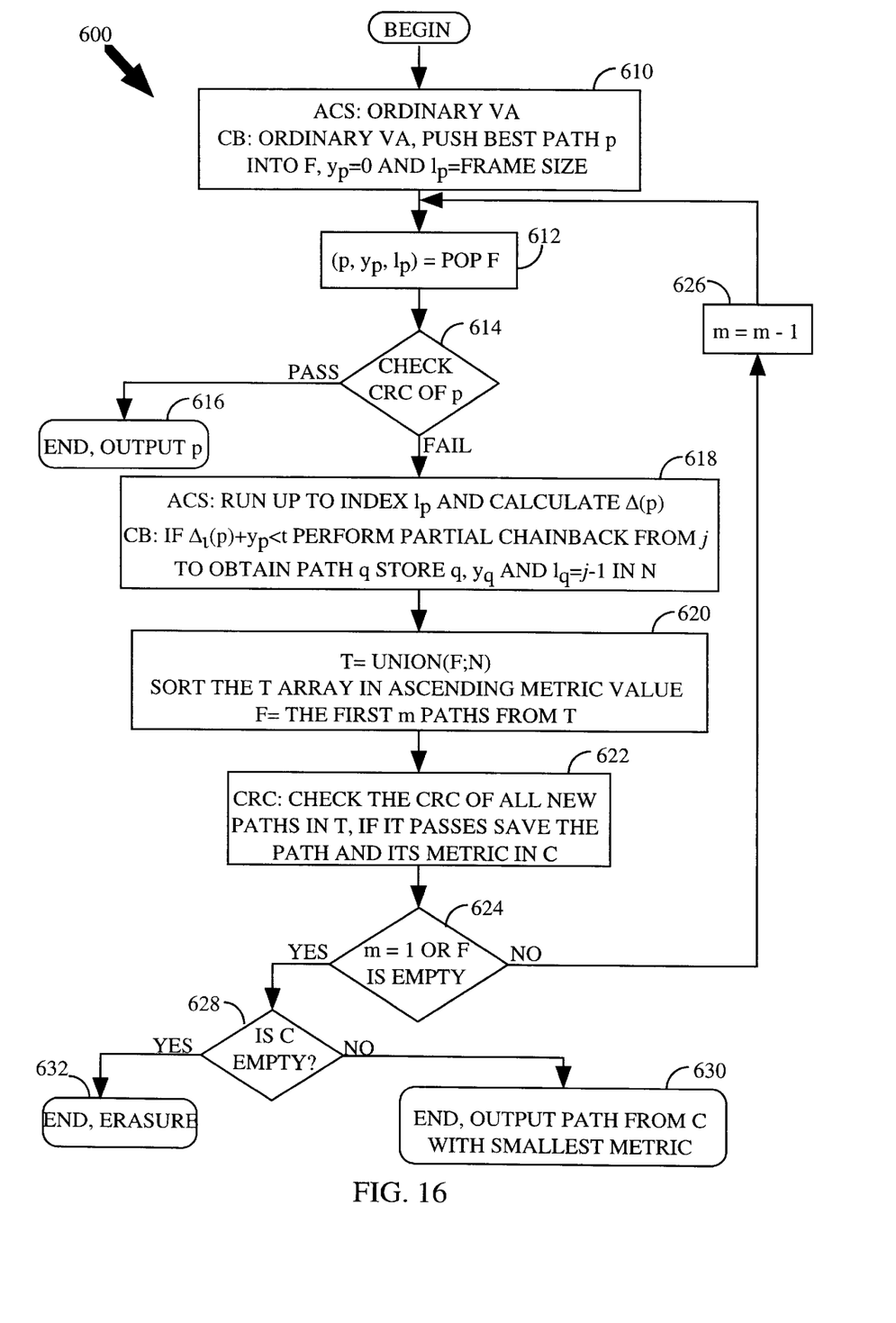
FIG. 16 is a flowchart which illustrates the threshold technique for selecting suboptimal paths of the present invention.

FIG. 16 is a flowchart of the method of the second exemplary embodiment which illustrates the threshold technique for selecting suboptimal paths of the present invention. This flowchart illustrates only the path search for one given rate hypothesis. The following definitions are useful to facilitate an understanding of the present invention:

p—a path in the trellis, here it will be given by its information sequence;

$y_p$—a metric of path p relative to the best path;

$l_p$—the smallest diverge point of path p;

F—an array of m paths of data, which contains their information sequence (p), their metric ($y_p$) and their smallest diverging point ($l_p$);

$\Delta(p)$—a vector of Yamamoto metrics of paths merging with the path p;

$\Delta_i(p)$—the ith value of vector $\Delta(p)$;

t—threshold, all paths considered will have a metric of less than t;

q—paths that diverge from another path (p), these paths are stored in an array N;

T—a temporary memory of paths;

C—a memory of paths with a CRC that passes; and

'partial chainback'—is a finite length chainback from a diverge point. The diverging information sequence is obtained by changing only this finite number of output bits in the path from which it diverges.

The two main parameters of this implementation are t, the threshold, and m, the number of times the ACS mechanism is rerun. The parameter n is generally small and is of the order of 2 to 4.

For the decoding of a given rate the procedure starts in block 610, where the modified Viterbi decoder 424 performs standard Viterbi decoding. The ACSs 454 update the state metrics 452 and output the decision bits to the chainback memory 458. The CB mechanism 460 performs a chainback to output the decoded data sequence to a memory array F located in the output buffer 426. Up to this point standard Viterbi decoding has been used as will be appreciated by those skilled in the art. Associated with the best path are two metrics: the metric relative to the best path $y_p$, which is obviously zero, and the smallest diverge point $l_p$, which is equal to the frame length. The significance of these two parameters will be come apparent in the following.

In block 612, control processor 434 identifies the first path and its parameters in the memory array F located in the output buffer 426. This path is represented by p. For the first run of the decoder this is the best path.

In block 614, the CRC of the path identified the block 612 is checked by the CRC mechanism 432. If the CRC passes, the procedure proceeds to block 616, and the decoding of the frame has terminated. Although not specifically shown in FIG. 16, other data concerning the frame may be output and or calculated, for example the re-encoded SER 428 or the likelihood metric of the decoded frame.

If the CRC check of block 614 fails, the controller 434 of the block 618 reruns the modified decoder 424 to find paths that merge with the path p. The ACSs 454 perform the state metric calculation and update 452 up to the point in the trellis $l_p$. In addition to the usual add, compare and select, the ACSs 454 of the modified decoder 424 perform an extra function. This is to output to the Δ sorting circuit 456 the value of the Yamamoto metric of the path, denoted q, that merges with the path p in the trellis at each index j up to index $l_{p'}$. The total metric of the path q that merges with p at index j ($1 \leq j \leq l_{p'}$) is given by $y_q = \Delta_j(p) + y_p$. If this metric $y_q$ is less than some given threshold t, the chainback control 460 performs a partial chainback from index j of path p in the trellis where the decision bit at index j is reversed. The result of the chainback procedure concatenated with the bits of path p for indices that are greater than j form the new path q. This path q, together with its metric relative to the best path and the diverge point $l_q = j-1$, are stored in array N in the output buffer 426.

After performing the partial chainbacks and obtaining new sequences according to the threshold in block 618, the procedure continues to block 620. In block 620 the control 434 recognizes the location of the sequences in the output buffer 426. An array T is defined that is the union of the previous m most probable paths and the new paths found, located in N. The m most likely paths of T are then defined as the new array F.

The procedure then proceeds to block 622 where the CRC 432 of all the new paths found are checked. These new paths in T were defined previously as array N. If any of the paths have a CRC that checks, the path and its metric are kept in an array denoted by C. It is obvious to one skilled in the art that the procedures performed in block 622 can be performed simultaneously to the procedures in block 618. It is also obvious that arrays denoted by T, F, N and C need not be defined as memory allocated arrays, but are pointers to sequences stored in the output buffers. These arrays are defined for clear explanation of the procedure.

If in block 624 the maximum number of decoder runs has been reached (m=1) or there are no more sequences to be processed that fit the threshold criteria (F is empty), the control processor 434 proceeds to block 628. If in block 628 there are no sequences that have a CRC that passed, i.e., array C is empty, the control processor 434 ends the decoding process for the current rate hypothesis and signals the selector 430 that no sequence was found. The control processor 434 may output to the selector 430 data concerning the unsuccessfully decoded rate hypothesis, e.g., likelihood metric of the best path, to assist the selector 430 in its decision.

If on the other hand C, in block 628, isn't empty, the process proceeds to block 630 where the control processor 434 outputs to the selector 430 the path with the smallest metric that passes the CRC check. The selector 430 may also be supplied with other data concerning the decoded frame, e.g., the SER 428 and the path's metric.

If in block 624, the maximum number of runs has not been reached by the decoder (m>1) and there are sequences to be processed (F isn't empty), the control processor 434 decrements m and the procedure continues to block 612 to continue processing the next most likely sequence (the first sequence in F).

Figure 17:
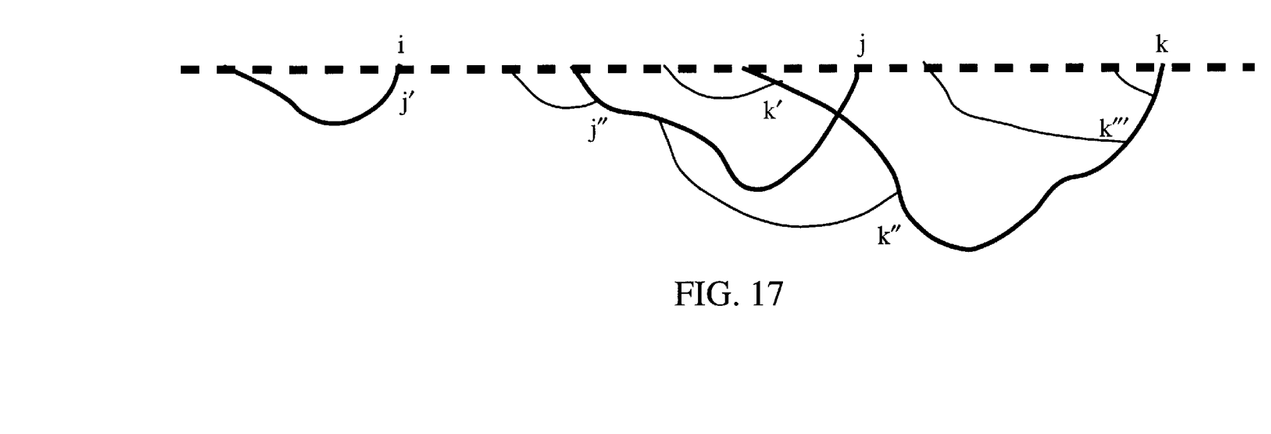
FIG. 17 is a trellis diagram illustration of paths ascertained by the second exemplary embodiment of the decoding method of the present invention.

FIG. 17 is a trellis diagram of paths ascertained by the second exemplary embodiment of the decoding method of the present invention. In FIG. 17, the best path (the one that is output by the Viterbi decoder 424, not the transmitted correct one) is depicted by the thick dashed line. The method may be illustrated by assuming that the CRC of the best path does not check. In the first rerun of the decoder, 3 paths are found to have a metric less than the threshold. Their diverge points are i, j, and k, and define information sequences. These are paths which diverge once from the best path. Assume the path that diverges at point j has the minimum metric and its CRC doesn't check. Looking for paths that diverge from this path, two paths are found and have a total metric of less than the threshold. These paths are j' and j". Now a second rerun of the decoder is performed. This time, paths are examined that diverge from the path with the minimum metric out of the set of paths i, k, j' and j". Assume that the k path has the minimum metric and its CRC doesn't check. Paths that diverge from k are now sought after. In the diagram, there are three paths with a metric less than the threshold, k', k" and k'".

Note that the required search time for paths diverging a given path is not constant as one only needs to run the decoder up to the diverge point. The decode cycles for the above example can be summarized in the following table:

TABLE 1

| Decode Cycles | CB Cycles |
|---|---|
| Ordinary Viterbi Algorithm (VA) | Ordinary VA |
| Ordinary VA + Δ vector from best path | Partial CB on i, j, & k |
|  | Partial CB on j' and j" |
| VA up to j + Δ vector from path j | Partial CB on k', k" and k'" |
| VA up to k + Δ vector from path k |  |

It should be noted that an additional buffers may be needed for each path for which merging paths are checked. Extra buffers are needed for the diverging paths. These buffers can be reused if the CRC does not check. In the example of FIG. 17, in all 9 paths were found and the decoder was only run 4 (n+2) times. In all 9 highly probable paths were found, but only 4 (n+2) of them are guaranteed to be the most likely. This is the innovative advantage of the second embodiment in respect to the first embodiment where by the decoder needs to be rerun at least once (or twice for the case of truncated chainback memory) for each extra path found. In the second exemplary embodiment the threshold criteria allows one to sometimes find more than one path for each rerun of the decoder and is not limited by decoder implementations using a truncated chainback.

In the case of a very reliable CRC (many bits) the decoding process can be stopped when the first sequence with a good CRC is found. In the case of an unreliable CRC, paths will be found as much as time allows (arrival of the next frame), and all paths with a CRC that passes will be kept and the decoder will decide on the path, with a good CRC, that has the smallest metric.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

We claim:

1. A decoding system for use with a multi-rate encoded signal, said decoding system comprising:

decoder means for receiving a frame of multi-rate encoded data and for trellis decoding said frame of data to provide a set of information bits and at least one check bit;

check means for receiving said information bits and said at least one check bit and for determining a validity of said decoding in accordance with said information bits and said at least one check bit, said validity being determined based upon at least one Yamamoto metric, wherein said decoder means further includes means for determining a second set of information bits and second at least one check bit in accordance with a suboptimal path when said determined validity of said decoding indicates a failure to properly decode said frame.

2. A decoding system for decoding a multi-rate encoded signal, comprising:

first means for decoding a multi-rate encoded information sequence representable by a trellis to provide a decoded sequence associated with an optimal path therethrough;

second means for validity checking check bits associated with said information sequence; and third means responsive to said second means for identifying a suboptimal path through said trellis including means for identifying paths having Yamamoto metrics within a predetermined threshold of a Yamamoto metric associated with the optimal path through said trellis.

3. A decoding method for use with multi-rate encoded signals, said decoding method comprising the steps of:

decoding a multi-rate encoded information sequence representable by a trellis to provide a decoded sequence associated with an optimal path therethrough;

validity checking check bits associated with said information sequence; and identifying a suboptimal path through said trellis including the step of identifying paths having Yamamoto metrics within a predetermined threshold of a Yamamoto metric associated with the optimal path through the trellis when the determined validity of the check bits indicates a failure to properly decode said sequence.

4. The decoding method of claim 3, wherein said step of validity checking comprises cyclic redundancy checking said check bits with respect to said information sequence.

5. The decoding method of claim 4, further comprising the step of cyclic redundancy checking said suboptimal path.

6. The decoding method of claim 3, wherein said metrics are Yamamoto metrics.

7. The decoding system of claim 1, wherein said decoder means includes means for determining said suboptimal path.

8. The decoding system of claim 7, wherein said means for determining said suboptimal path includes means for identifying suboptimal paths having Yamamoto metrics within a predetermined threshold of a Yamamoto metric associated with an optimal path through a trellis.

9. The decoding system of claim 1, wherein said check means includes means for cyclic redundancy checking said check bits with respect to said information bits.

10. The decoding system of claim 2, wherein said means for decoding comprises a Viterbi decoder.

11. The decoding system of claim 2, wherein said means for validity checking includes means for cyclic redundancy checking said check bits with respect to said information sequence.

12. The decoding system of claim 2, wherein said third means includes means for selecting one of said paths as a suboptimal path.

13. The decoding system of claim 12, further including means for cyclic redundancy checking said suboptimal path.

* * * * *